(12) United States Patent
Shirahashi et al.

(10) Patent No.: US 12,712,143 B2
(45) Date of Patent: Aug. 18, 2026

(54) ELECTRON BEAM IRRADIATION DEVICE

(71) Applicant: NHV CORPORATION, Kyoto (JP)

(72) Inventors: Tomonori Shirahashi, Kyoto (JP); Takashi Baba, Kyoto (JP); Hirotaka Hayashi, Kyoto (JP); Hideyuki Asano, Kyoto (JP)

(73) Assignee: NHV CORPORATION, Kyoto (JP)

( * ) Notice: Subject to any disclaimer, the term of this patent is extended or adjusted under 35 U.S.C. 154(b) by 175 days.

(21) Appl. No.: 18/285,385

(22) PCT Filed: Apr. 28, 2021

(86) PCT No.: PCT/JP2021/017054
§ 371 (c)(1),
(2) Date: Oct. 3, 2023

(87) PCT Pub. No.: WO2022/230135
PCT Pub. Date: Nov. 3, 2022

(65) Prior Publication Data

US 2024/0186099 A1 Jun. 6, 2024

(51) Int. Cl.
*H01J 37/02* (2006.01)
*H01J 37/06* (2006.01)
*H01J 37/16* (2006.01)

(52) U.S. Cl.
CPC ............ *H01J 37/026* (2013.01); *H01J 37/06* (2013.01); *H01J 37/16* (2013.01); *H01J 2237/0213* (2013.01); *H01J 2237/038* (2013.01)

(58) Field of Classification Search
CPC .......... H01J 37/026; H01J 37/06; H01J 37/16; H01J 37/165; H01J 2237/0213; H01J 2237/038; H01J 19/57
See application file for complete search history.

(56) References Cited

U.S. PATENT DOCUMENTS

| | | | | |
|---|---|---|---|---|
| 7,671,522 B2 * | 3/2010 | Lee | .......................... | G21K 5/02 313/289 |
| 10,593,505 B1 | 3/2020 | Katsap | | |
| 2005/0225224 A1 * | 10/2005 | Dally | ...................... | H01J 33/04 313/361.1 |

FOREIGN PATENT DOCUMENTS

| | | | |
|---|---|---|---|
| CN | 1574178 A * | 2/2005 | ............ H01J 29/864 |
| CN | 108463858 | 8/2018 | |
| JP | 2006162535 | 6/2006 | |

(Continued)

OTHER PUBLICATIONS

“International Search Report (Form PCT/ISA/210) of PCT/JP2021/017054”, mailed on Jun. 1, 2021, with English translation thereof, pp. 1-2.

(Continued)

*Primary Examiner* — David E Smith

(74) *Attorney, Agent, or Firm* — JCIPRNET

(57) ABSTRACT

An electron beam irradiation device (1) irradiates an electron beam from an electrode (12) that is connected to a tip of a conductive part (21) which projects inside a vacuum container (11), to the exterior of the vacuum container (11) via a metal foil (111) that constitutes a portion of a peripheral wall of the vacuum container (11). The electron beam irradiation device (1) includes a tubular insulator (22) that surrounds the periphery of the conductive part (21) in the vacuum container (11), and an amorphous carbon film (23) that covers the outer peripheral surface of the insulator (22).

5 Claims, 3 Drawing Sheets

(56) References Cited

FOREIGN PATENT DOCUMENTS

| | | | |
|---|---|---|---|
| JP | 2012052909 | | 3/2012 |
| JP | 2019002784 | | 1/2019 |
| JP | 2019002784 A | * | 1/2019 |

OTHER PUBLICATIONS

"Office Action of Germany Counterpart Application", issued on Feb. 19, 2026, with English translation thereof, p. 1-p. 5.

"Office Action of China Counterpart Application No. 202180096961.5", issued on Jul. 8, 2026, p. 1-p. 13.

* cited by examiner

ELECTRON BEAM IRRADIATION DEVICE

CROSS-REFERENCE TO RELATED APPLICATION

This application is a 371 application of the International PCT application serial no. PCT/JP2021/017054, filed on Apr. 28, 2021. The entirety of the above-mentioned patent application is hereby incorporated by reference herein and made a part of this specification.

TECHNICAL FIELD

The present invention relates to an electron beam irradiation device.

RELATED ART

Conventionally, a reaction or a treatment has been performed utilizing an electron beam in place of heat or light. In an electron beam irradiation device that irradiates or emits an electron beam, when a high voltage is applied to an electrode, discharge may occur from an unintended portion in a conductive part. In a technology for suppressing such unintended discharge, a configuration is known in which an electrode support that is connected to an electrode and applies a voltage to the electrode has a surface covered with an insulating coating layer (see, for example, Patent Document 1).

PRIOR-ART DOCUMENTS

Patent Documents

Patent Document 1: Japanese Patent Laid-open No. 2012-52909

SUMMARY OF THE INVENTION

Problems to be Solved by the Invention

In the above conventional electron beam irradiation device, in the case where a relatively high voltage is applied, discharge may occur from the coating layer to the outside, which may damage a portion of the electron beam irradiation device. As described above, irradiation with an electron beam may be used in the manufacture of a product involving a reaction or a treatment by the electron beam. Hence, when a portion of the electron beam irradiation device is damaged, there may arise a need to stop the entire production line of the product. Thus, in the electron beam irradiation device, a technology that enables stable continuous operation even at high output is in demand.

An object of the present invention is to provide a technology that enables stable continuous operation even at high output in an electron beam irradiation device.

Means for Solving the Problems

One aspect of the present invention for solving the above problem is an electron beam irradiation device adapted for irradiating an electron beam from an electrode connected to a tip of a conductive part projecting inside a vacuum container to the exterior of the vacuum container via a metal foil that constitutes a portion of a peripheral wall of the vacuum container. The electron beam irradiation device includes an insulator of a tubular shape surrounding a periphery of the conductive part in the vacuum container. The insulator has an amorphous carbon film covering one or both of an inner peripheral surface and an outer peripheral surface of the insulator.

Effects of the Invention

In the present invention, a technology can be provided that enables stable continuous operation even at high output in an electron beam irradiation device.

DESCRIPTION OF THE EMBODIMENTS

First Embodiment

Overall Configuration

Figure 1:
FIG. 1 schematically illustrates a configuration of an electron beam irradiation device according to one embodiment of the present invention.
Figure 1:
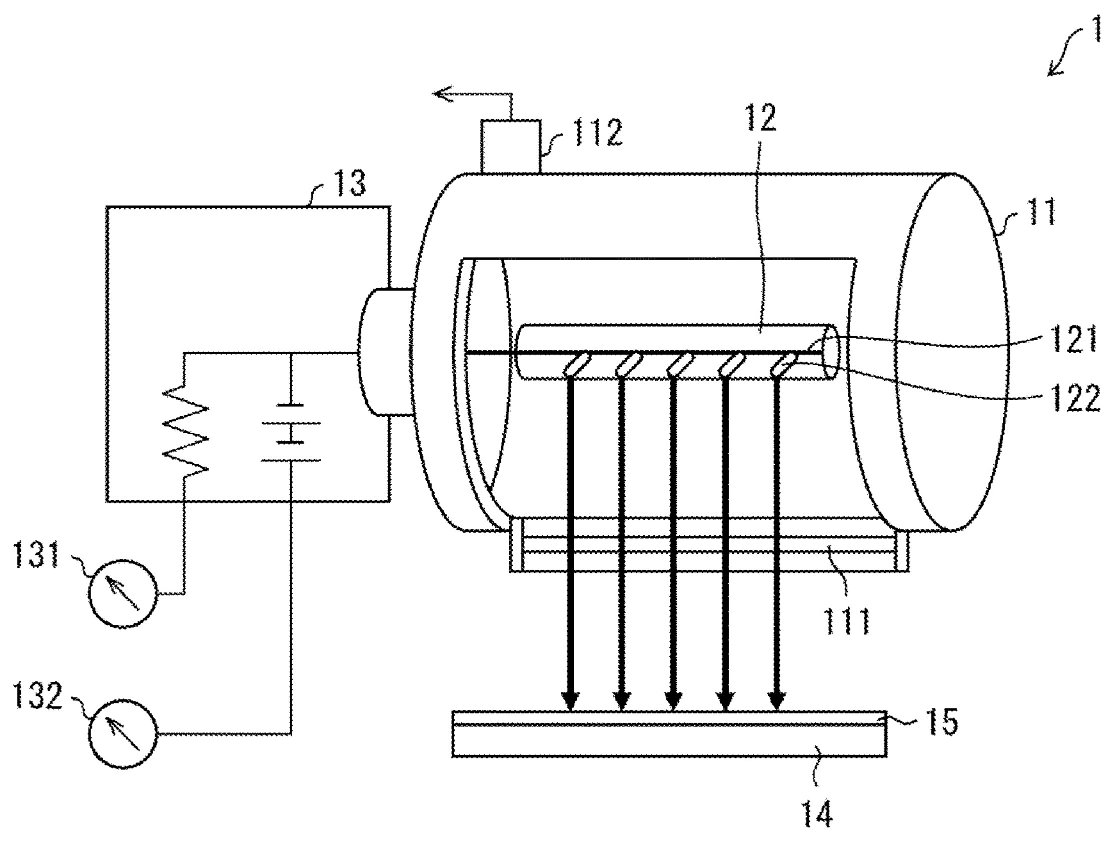

FIG. 1 schematically illustrates a configuration of an electron beam irradiation device according to one embodiment of the present invention. As illustrated in FIG. 1, an electron beam irradiation device 1 includes a vacuum container 11 that is hollow and of a substantially columnar shape, an electrode 12 supported by an inner wall side on one end side of the vacuum container 11 and arranged inside the vacuum container 11, and a DC power supply 13 that applies a DC voltage to the electrode 12. An acceleration voltage monitor 131 and an electron flow monitor 132 are connected to the DC power supply 13.

In a portion of a peripheral wall of the vacuum container 11, a metal foil 111 extending along an axial direction of the vacuum container 11 is provided. The vacuum container 11 has an exhaust port 112 for decompression. The exhaust port 112 is connected to a vacuum pump (not illustrated).

The electrode 12 includes a conducting wire 121 and a plurality of filaments 122 branching from the conducting wire 121. A configuration supporting the electrode 12 within the vacuum container 11 will be described later in detail.

By reducing the pressure inside the vacuum container 11 to a predetermined degree of vacuum and applying a DC high voltage from the DC power supply 13 to the electrode 12 inside the vacuum container 11, thermally excited electrons are emitted from a surface of the filament 122. The emitted electrons penetrate the metal foil 111 and are irradiated onto an object in the atmosphere, for example, a coating film 15 on a base material 14. In this way, the electron beam irradiation device 1 is configured to irradiate an electron beam from the electrode 12 inside the vacuum container 11 to the exterior of the vacuum container 11 via the metal foil 111.

Figure 2:
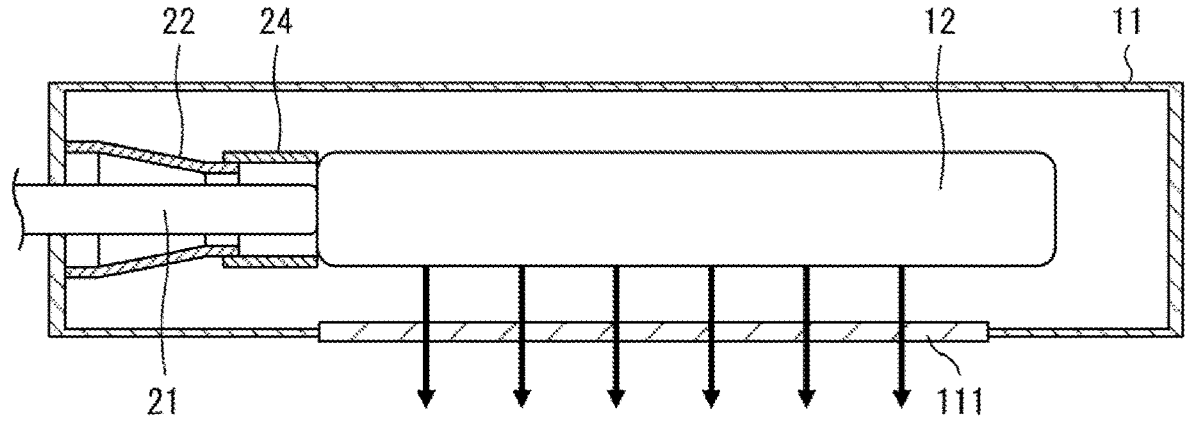
FIG. 2 is a partial cross-sectional view schematically illustrating a configuration inside a vacuum container according to one embodiment of the present invention.

FIG. 2 is a partial cross-sectional view schematically illustrating a configuration inside a vacuum container according to the present embodiment. As illustrated in FIG. 2, a conductive part 21 projects inside the vacuum container 11 from one end wall of the vacuum container 11. The conductive part 21 is connected to the DC power supply 13 outside the vacuum container 11. The electrode 12 is connected to a tip of the conductive part 21. The conductive part 21 is electrically connected to the conducting wire 121 of the electrode 12, and current from the DC power supply 13 is supplied to the conducting wire 121 via the conductive part 21.

An insulator 22 of a tubular shape surrounding a periphery of the conductive part 21 is arranged inside the vacuum container 11. The insulator 22 is also referred to as a "bushing". Furthermore, in a gap between a tip of the insulator 22 and a base end of the electrode 12, a cover 24 of a cylindrical shape is arranged covering the gap from the outside. The cover 24 is also referred to as a "hoop". The insulator 22 is arranged so that a base end surface thereof is in airtight contact with an inner wall surface of the vacuum container 11 and a tip end surface thereof is in airtight contact with a flange (not illustrated). In this way, the insulator 22 is arranged inside the vacuum container 11 so that the interior of the insulator 22 is isolated from the interior of the vacuum container 11.

[Insulator]

Figure 3:
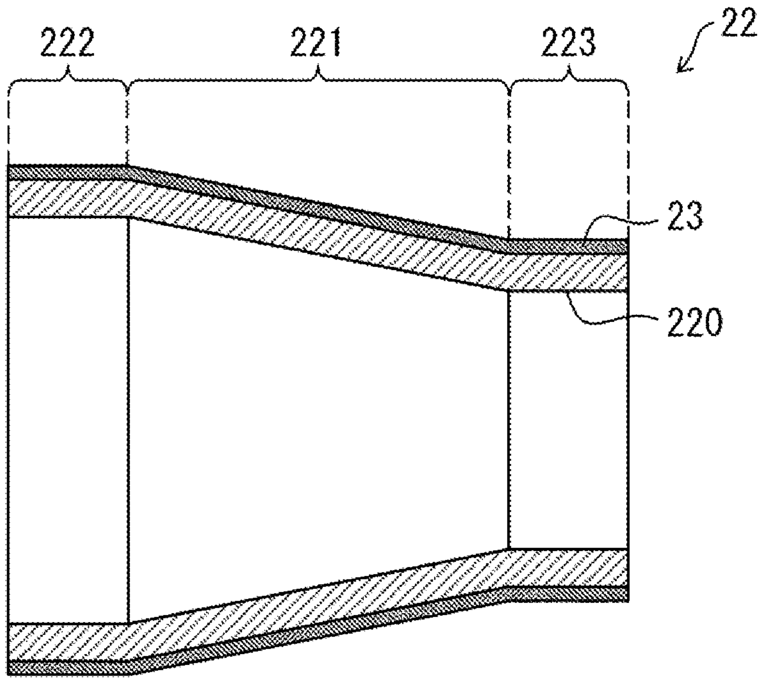
FIG. 3 is a cross-sectional view schematically illustrating a configuration of an insulator having an integral structure according to one embodiment of the present invention.

FIG. 3 is a cross-sectional view schematically illustrating a configuration of an insulator having an integral structure according to the present embodiment. As illustrated in FIG. 3, the insulator 22 is an integral structure including a tapered tube 221 where an inner diameter and an outer diameter of the insulator 22 gradually decrease from a base end side toward a tip side of the insulator 22.

More in detail, the insulator 22 includes an insulator body 220 and an amorphous carbon film (diamond-like carbon (DLC) film) 23 covering an outer peripheral surface of the insulator body 220. The insulator body 220 includes the tapered tube 221, a first cylinder 222 connected to an edge of a relatively large opening of the tapered tube 221, and a second cylinder 223 connected to an edge of a relatively small opening of the tapered tube 221. A thickness of a peripheral wall of the insulator body 220 is, for example, substantially constant at any portion, and is, for example, 10 to 20 mm.

The insulator body 220 has insulation properties. A material of the insulator body 220 is appropriately selected from a range enabling the insulation properties required for the insulator 22 to be exhibited. Examples of the material of the insulator body 220 include a metal oxide. Examples of the metal oxide include aluminum oxide. In the present embodiment, the insulator body 220 is made of, for example, aluminum oxide.

The DLC film 23 is directly formed on the outer peripheral surface of the insulator body 220. The DLC film 23 is produced on the outer peripheral surface of the insulator body 220 by a known method such as plasma chemical vapor deposition (CVD) or physical vapor deposition (PVD).

A current flowing through the DLC film 23 is a current flowing between both ends of the insulator 22. A set value of the current can be appropriately determined according to the use of the electron beam irradiation device 1, the material of the insulator body 220, the shape and size of the insulator, and the like. A diameter of the insulator 22 and a thickness of the DLC film 23 are in an inversely proportional relationship. As the diameter of the insulator 22 increases, the thickness of the DLC film 23 tends to decrease.

For example, in the insulator 22, in the case where the set value of the current is about 1 to 400 μA, the thickness of the DLC film 23 is 0.5 to 5 μm. If the thickness of the DLC film 23 is excessively small, charging of the insulator 22 may not be able to be sufficiently suppressed; if excessively large, heat generated due to Joule loss may increase. The thickness of the DLC film 23 may be constant, or may be appropriately adjusted according to the likelihood of penetration discharge in a portion where penetration discharge is likely to occur.

[Cover]

Figure 4:
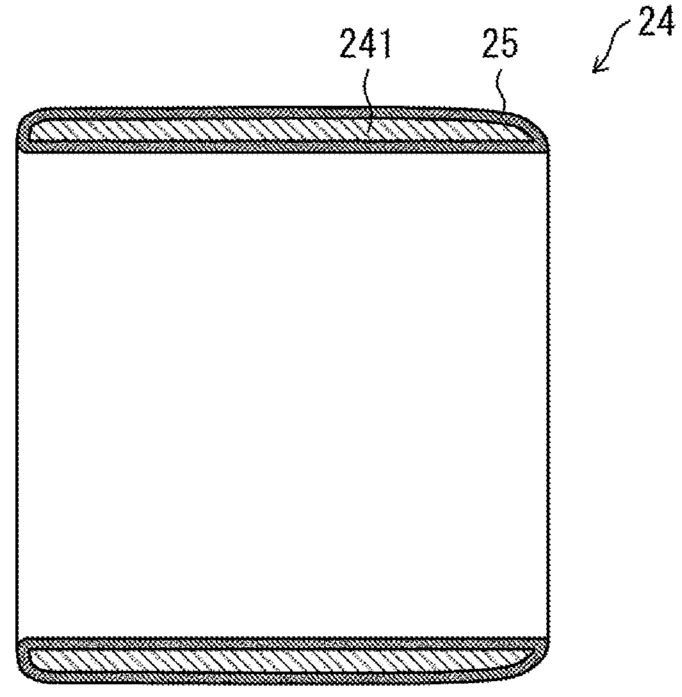
FIG. 4 is a cross-sectional view schematically illustrating a configuration of a cover according to one embodiment of the present invention.

FIG. 4 is a cross-sectional view schematically illustrating a configuration of a cover according to one embodiment of the present invention. As illustrated in FIG. 4, the cover 24 includes a cover body 241 having a substantially cylindrical shape and a DLC film 25 covering a surface of the cover body 241. An opening diameter of one end of the cover 24 is larger than an opening diameter of the other end. An opening on one end side of the cover 24 on the left side with respect to the paper surface of FIG. 4 is connected to the insulator 22, and an opening on the other end side of the cover 24 on the right side with respect to the paper surface of FIG. 4 is connected to the electrode 12.

An outer shape of the cover body 241 is a rounded shape in which an outer diameter of the cover body 241 at an end of the cover body 241 gradually varies in an axial direction of the cover body 241. The cover 24 connects an outer shape of the insulator 22 with an outer shape of the electrode 12 by a shape including the rounded shape and having no corners.

The cover body 241 is made of stainless steel and has a structure that can be divided into a plurality of (for example, two) portions in the axial direction. Both an inner peripheral surface and an outer peripheral surface of the cover body 241 are covered with the DLC film 25. A thickness of the DLC film 25 on a surface of the cover body 241 can be determined from the viewpoint of suppressing secondary electron emission in the cover 24. From this viewpoint, the thickness of the DLC film 25 may be, for example, 0.5 to 5 μm.

[Use of Electron Beam Irradiation Device]

In the electron beam irradiation device 1, a voltage is applied to the electrode 12 at an acceleration voltage of 50 to 350 kV or higher, and an electron beam is emitted. The electron beam passes through the metal foil 111 and is irradiated onto an object (for example, the coating film 15) to be irradiated. In the electron beam irradiation device 1, the electron beam can be irradiated stably and continuously for a long time at an acceleration voltage in the above range.

In an embodiment of the present invention, the object to be irradiated is not limited. The object to be irradiated is preferably an object to be produced or treated by continuous irradiation with the electron beam. For example, the electron beam irradiation device 1 is suitably used in the manufacture of a sheet material by crosslinking or polymerization of components in a coating film on a base material, or in disinfection or sterilization of an article.

[Regarding Leakage of Current]

Here, leakage of current in the electron beam irradiation device 1 is described. While the insulator 22 has insulation properties, an outer peripheral surface of the insulator 22 is charged by supply of power to the conductive part 21. Charging of the outer peripheral surface of the insulator 22 is likely to occur in a portion close to the conductive part 21 and where the shape of the insulator 22 varies relatively greatly, for example, a boundary between the tapered tube 221 and the second cylinder 223 and the vicinity thereof. In the electron beam irradiation device 1, when the outer peripheral surface of the insulator 22 is charged to some extent (for example, about 1 $mC/m^2$), discharge (penetration discharge) occurs in a direction penetrating the insulator 22. When penetration discharge occurs frequently, the insulator 22 may be damaged.

Generally, the insulator 22 is filled with insulating oil or gas for insulation. When the insulator 22 is damaged, the filled insulating oil or gas leaks into the vacuum container 11, and a desired degree of vacuum may not be able to be maintained. Hence, when the insulator 22 is damaged by penetration discharge, it is necessary to stop the operation of the electron beam irradiation device 1, replace the insulator 22, fill insulating oil or gas into the insulator 22, and evacuate the vacuum container 11.

As described above, the cover 24 is basically formed by a curved surface. However, electric field concentration is likely to occur in a portion such as an edge where the shape varies greatly. As a result, discharge may occur. When discharge occurs from the cover 24 toward the insulator 22, the amount of charge on the outer peripheral surface of the insulator 22 may increase, and penetration discharge in the insulator 22 may be relatively likely to occur. When secondary discharge occurs on the outer peripheral surface of the insulator 22 due to discharge from the cover 24, the charge on the outer peripheral surface of the insulator 22 may decrease, and the insulator 22 may be damaged due to the secondary discharge, or alternatively, the outer peripheral surface of the insulator 22 tends to be likely to be charged.

Effects of Present Embodiment

In the electron beam irradiation device 1, leakage of current from the insulator 22 is substantially prevented. The DLC film 23 has a high resistance value, and has higher conductivity than the insulator body 220. Hence, local charging on a surface of the insulator 22 is suppressed.

Since the outer peripheral surface of the insulator 22 is composed of the DLC film 23, a secondary discharge coefficient on the outer peripheral surface of the insulator 22 is less than that of the insulator body 220. Thus, even if the outer peripheral surface of the insulator 22 is subjected to discharge, secondary discharge from the outer peripheral surface of the insulator 22 is suppressed, and charging on the outer peripheral surface of the insulator 22 is less likely to be promoted. Thus, the occurrence of penetration discharge penetrating a wall surface of the insulator 22 is substantially prevented.

In the electron beam irradiation device 1, since the DLC film 25 is formed on the entire surface of the cover 24, a secondary electron coefficient on the surface of the cover 24 is reduced and secondary discharge is less likely to occur. Thus, the above-described problem due to secondary discharge is relatively less likely to occur.

Second Embodiment

Another embodiment of the present invention will be described below. For convenience of description, members having the same functions as those described in the above embodiment are denoted by the same reference numerals, and description thereof will not be repeated. An electron beam irradiation device of the present embodiment has the same configuration as the electron beam irradiation device of the first embodiment described above, except that the insulator is different.

Figure 5:
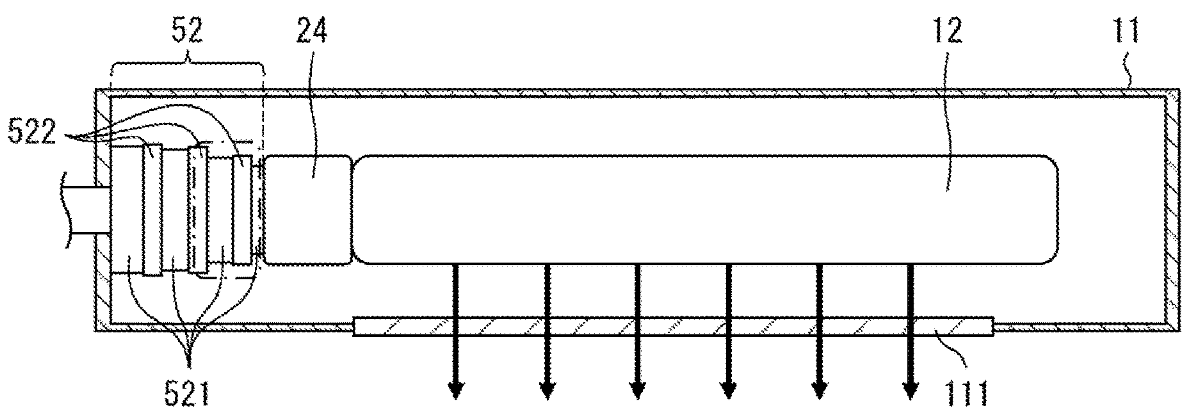
FIG. 5 is a partial cross-sectional view schematically illustrating a configuration inside a vacuum container according to another embodiment of the present invention.
Figure 6:
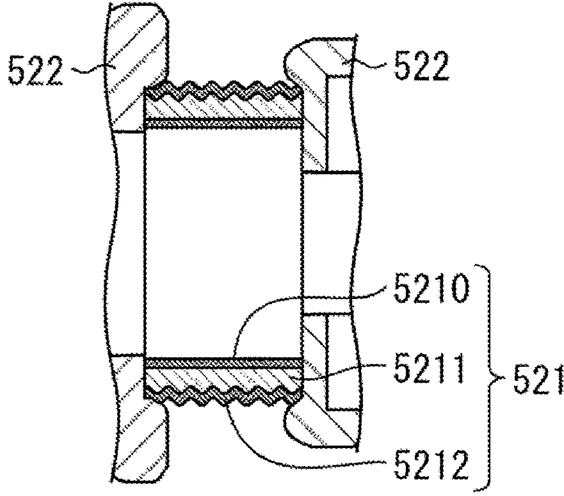
FIG. 6 is a cross-sectional view schematically illustrating a configuration of an insulator unit according to another embodiment of the present invention.

FIG. 5 is a partial cross-sectional view schematically illustrating a configuration inside a vacuum container according to the present embodiment. FIG. 6 is a cross-sectional view schematically illustrating a configuration of an insulator unit according to the present embodiment. The range illustrated in FIG. 6 corresponds to, for example, a portion surrounded by a dot-and-dash line in FIG. 5. In the present embodiment, an insulator 52 is configured by connecting a plurality of insulator units 521 of a cylindrical shape. The insulator unit 521 is connected to the adjacent insulator unit 521 via a connecting jig 522. Among the plurality of insulator units 521, the insulator unit 521 arranged closer to the electrode 12 has a smaller outer diameter.

The insulator unit 521 includes an insulator unit body 5211 made of ceramic such as aluminum oxide and of a cylindrical shape, a DLC film 5210 formed on an inner peripheral surface of the insulator unit body 5211, and a DLC film 5212 formed on an outer peripheral surface of the insulator unit body 5211. An outer peripheral wall of the insulator unit body 5211 has an uneven shape that is repeated along an axial direction. An inner peripheral surface of the insulator unit 521 is covered with the DLC film 5210. The outer peripheral wall of the insulator unit body 5211 is covered with the DLC film 5212 along the uneven shape.

The connecting jig 522 is, for example, a member made of metal and of a substantially cylindrical shape, and is configured so that an end surface thereof is in airtight contact with an end surface of the insulator unit 521. An outer shape of an end of the connecting jig 522 is formed in a continuous shape represented by a curve in a cross section of the connecting jig 522. The space inside the insulator 52 formed by the insulator unit 521 and the connecting jig 522 is isolated from the space inside the vacuum container 11, and the space inside the insulator 52 is filled with gas.

In the present embodiment, charging on the inner peripheral surface of the insulator unit 521 is prevented, and a secondary discharge coefficient of the inner peripheral surface of the insulator unit 521 is reduced. Thus, it is possible to prevent the insulator 52 from being damaged by discharge inside the insulator 52, and to realize stable continuous operation of electron beam irradiation.

In the present embodiment, charging on an outer peripheral surface of the insulator unit 521 is also prevented, and a secondary discharge coefficient of the outer peripheral surface of the insulator unit 521 is reduced. Thus, similarly to the first embodiment described above, the occurrence of penetration discharge penetrating a wall surface of the insulator unit 521 is substantially prevented, and the above-described problem due to secondary discharge on a surface of the insulator unit 521 is relatively less likely to occur.

Other Embodiments

The present invention is not limited to each of the embodiments described above, and various modifications are possible within the scope of the claims. Embodiments obtained by appropriately combining technical means respectively disclosed in different embodiments are also included in the technical scope of the present invention.

In an embodiment of the present invention, since an insulator has insulation properties, from the viewpoint of preventing charging on a surface of the insulator, it is effective to form a DLC film on either an outer peripheral surface or an inner peripheral surface of the insulator.

In an embodiment of the present invention, from the viewpoint of reducing a secondary discharge coefficient on the surface of the insulator, the DLC film is preferably formed on the surface on a side where discharge from the insulator may occur. For example, in the case where insulating oil is filled inside the insulator, the DLC film is preferably formed on the outer peripheral surface of the insulator. In the case where gas is filled inside the insulator, the DLC film is preferably formed on the inner peripheral surface of the insulator from the viewpoint of suppressing charging due to secondary discharge inside the insulator, and the DLC film is preferably formed on the outer peripheral surface of the insulator from the viewpoint of suppressing charging due to secondary discharge outside the insulator.

In an embodiment of the present invention, the DLC film on a cover may be formed only on an outer peripheral surface of the cover, and may not be formed on an inner peripheral surface. As described in the above embodiment, an aspect in which the DLC film is formed on the entire surface of the cover is preferable from the viewpoint of easily forming the DLC film on a surface of the cover.

In an embodiment of the present invention, the DLC film may also be formed on a surface of a part that constitutes a conductive part or an electrode. Examples of the part that constitutes the conductive part or the electrode include a flange that constitutes the conductive part, or an insulating (ceramic) support member for supporting a conducting wire. The part may include an edge or a corner where the shape varies sharply. In such a portion such as an edge, electric field concentration is likely to occur; as a result, discharge is likely to occur. When the DLC film is formed on the surface of the part including a portion such as an edge, a secondary discharge coefficient on the surface of the part can be reduced, which is advantageous from the viewpoint of further suppressing the occurrence of discharge in the electron beam irradiation device. For the same reason, it is preferable to form the DLC film on one or both of an outer peripheral surface and an inner peripheral surface of a connecting jig in the second embodiment.

In an embodiment of the present invention, the insulator may further include other layers than the DLC film as long as the effect of an embodiment of the present invention can be obtained. For example, the insulator may further include an intermediate layer between an insulator body or insulator unit body and the DLC film. From the viewpoint of obtaining the effect of the above embodiment, the intermediate layer is preferably a layer having a higher resistance than the DLC film.

The insulator in an embodiment of the present invention may have other structures than the insulator of the first embodiment or the insulator of the second embodiment described above. For example, the insulator in an embodiment of the present invention may be an integrally configured cylindrical body made of ceramic.

It is possible that the features (that is, the insulator and the DLC film described above) of an embodiment of the present invention are also applicable to other devices than the electron beam irradiation device that includes a configuration of the vacuum container, the conductive part and the electrode and generates an electron beam in a vacuum atmosphere described above. Examples of such other devices include an X-ray generating tube.

In an embodiment of the present invention, it is possible that only the insulator has the DLC film and the cover may not have a DLC film. An outer shape of the cover has a shape that continuously varies, and concentration of charge is less likely to occur. Since the DLC film is formed on the outer peripheral surface of the insulator, even if discharge occurs from the cover toward the insulator, secondary electron emission on the outer peripheral surface of the insulator is suppressed. Hence, charging on the outer peripheral surface of the insulator is prevented; as a result, the occurrence of discharge in the insulator can be sufficiently suppressed.

In an embodiment of the present invention, an insulator unit may have a DLC film on an outer peripheral surface thereof. This configuration is preferable from the viewpoint of suppressing the occurrence of charging and discharge on a vacuum atmosphere side of the insulator 52 in the second embodiment described above. Alternatively, the insulator unit may have the DLC film on both the outer peripheral surface and the inner peripheral surface. For example, since the insulator unit described above is of a substantially cylindrical shape, it is possible to easily form the DLC film on both peripheral surfaces. This configuration is preferable from the viewpoint of suppressing the occurrence of charging and discharge both inside and outside the insulator 52.

Conclusion

As is clear from the above description, an electron beam irradiation device (1) of an embodiment of the present invention is an electron beam irradiation device adapted for irradiating an electron beam from an electrode (12) connected to a tip of a conductive part (21) projecting inside a vacuum container (11) to the exterior of the vacuum container via a metal foil (111) that constitutes a portion of a peripheral wall of the vacuum container. The electron beam irradiation device includes an insulator (22) of a tubular shape surrounding a periphery of the conductive part in the vacuum container. The insulator has an amorphous carbon film (DLC film 23) covering one or both of an inner peripheral surface and an outer peripheral surface of the insulator. Thus, the electron beam irradiation device of an embodiment of the present invention is capable of stable continuous operation even at high output.

In an embodiment of the present invention, the insulator may include a tapered tube (221) where an inner diameter and an outer diameter of the insulator gradually decrease from a base end side toward a tip side of the insulator, and the amorphous carbon film may cover the outer peripheral surface of the insulator. This configuration is relatively effective from the viewpoint of suppressing charging in the insulator, since the insulator is composed of an integral body having a continuously varying shape.

Alternatively, the insulator may include one or two or more insulator units (521) of a cylindrical shape. The insulator unit may have an amorphous carbon film (DLC films 5210 and 5212) covering one or both of an inner peripheral surface and an outer peripheral surface of the insulator unit. This configuration is relatively effective from the viewpoint of simply configuring the insulator in an embodiment of the present invention.

The insulator of a cylindrical shape may be configured by connecting a plurality of insulator units of a cylindrical shape. Among the plurality of insulator units, the insulator unit arranged closer to the electrode may have a smaller outer diameter. This configuration is relatively effective from the viewpoint of easily forming a surface of the insulator with an amorphous carbon film.

The electron beam irradiation device of an embodiment of the present invention may further include a cover (24) of a cylindrical shape surrounding a periphery of a portion between a tip of the insulator and a base end of the electrode. The cover may have an amorphous carbon film covering one or both of an inner peripheral surface and an outer peripheral surface of the cover. This configuration is relatively effective from the viewpoint of suppressing discharge in the cover.

EXAMPLES

More specific operation examples of the electron beam irradiation device of the present invention will be described below.

Example 1

An insulator made of aluminum oxide as illustrated in FIG. 3 described in the first embodiment was prepared. The insulator had a length of 350 mm, a first cylinder had an outer diameter of 275 mm and a length of 55 mm, and a second cylinder had an outer diameter of 180 mm and a length of 50 mm. The insulator had a DLC film on an outer peripheral surface thereof, and a thickness of this DLC film was about 1 μm. An electron beam irradiation device A as described in the first embodiment was prepared using this insulator.

On the other hand, for comparison, a comparative insulator (insulator body only) made of aluminum oxide and having the above dimensions was prepared, and an electron beam irradiation device B as described in the first embodiment was prepared using this insulator.

By use of the electron beam irradiation device A, a voltage was applied to the electrode 12 and an irradiation operation with an electron beam was performed continuously for four hours. An acceleration voltage was 330 kV. When the voltage applied to the electrode 12 was detected, a leakage current of 10 μA was detected four hours after the start of operation. An excessive leak current of 6 mA or more was detected once after four hours from the start of operation.

On the other hand, by use of the electron beam irradiation device B, a voltage was applied to the electrode 12 and an irradiation operation with an electron beam was performed continuously for three hours. An acceleration voltage was 320 kV. When the voltage applied to the electrode 12 was detected, a leakage current of 156 μA was detected four hours after the start of operation. A leak current of 6 mA or more was detected only 13 times in total after 1.5 hours from the start of operation.

In this way, by forming a DLC film on an outer peripheral surface of an insulator of a substantially tapered tubular shape in an electron beam irradiation device, leakage current is greatly reduced, and the occurrence frequency of excessive leak current of 6 mA or more is greatly reduced.

Example 2

By use of the electron beam irradiation device A, an irradiation operation with an electron beam was performed continuously for 24 hours under the conditions of an acceleration voltage of 300 kV and a current of 100 mA. A degree of vacuum was 9.5×10−5 Pa. During the continuous operation for 24 hours, suspension of operation (actuation of interlocking) due to discharge in a vacuum container never occurred.

By use of the electron beam irradiation device B, an irradiation operation with an electron beam was performed continuously for 24 hours under the conditions of an acceleration voltage of 250 kV and a current of 100 mA. A degree of vacuum was $9.5\times10^{-5}$ Pa. During this period, actuation of interlocking never occurred.

However, as an attempt, an irradiation operation with an electron beam was performed continuously for 24 hours under the conditions of an acceleration voltage of 300 kV and a current of 100 mA by use of the electron beam irradiation device B. However, actuation of interlocking occurred frequently, and stable operation was unable to be carried out.

In this way, by forming a DLC film on an outer peripheral surface of an insulator of a substantially tapered tubular shape in an electron beam irradiation device, it becomes possible to stably carry out continuous operation at a relatively high acceleration voltage.

The invention claimed is:

1. An electron beam irradiation device, adapted for irradiating an electron beam from an electrode connected to a tip of a conductive part projecting inside a vacuum container to exterior of the vacuum container via a metal foil that constitutes a portion of a peripheral wall of the vacuum container, wherein the electron beam irradiation device comprises an insulator of a tubular shape surrounding a periphery of the conductive part in the vacuum container;

the insulator has an amorphous carbon film covering one or both of an inner peripheral surface and an outer peripheral surface of the insulator;

a cover of a cylindrical shape, surrounding a periphery of a portion between a tip of the insulator and a base end of the electrode; and the cover has an amorphous carbon film covering one or both of an inner peripheral surface and an outer peripheral surface of the cover.

2. The electron beam irradiation device according to claim 1, wherein the insulator comprises a tapered tube where an inner diameter and an outer diameter of the insulator gradually decrease from a base end side toward a tip side of the insulator; and the amorphous carbon film covers the outer peripheral surface of the insulator.

3. The electron beam irradiation device according to claim 1, wherein the insulator comprises one or two or more insulator units of a cylindrical shape; and the insulator unit has an amorphous carbon film covering one or both of an inner peripheral surface and an outer peripheral surface of the insulator unit.

4. The electron beam irradiation device according to claim 3, wherein the insulator is configured by connecting a plurality of insulator units of a cylindrical shape; and among the plurality of insulator units, the insulator unit arranged closer to the electrode has a smaller outer diameter.

5. The electron beam irradiation device according to claim 1, wherein the insulator comprises a plurality of insulator units connected via a plurality of connecting jigs that is made of metal.

* * * * *